(12) United States Patent
Caffee et al.

(10) Patent No.: US 9,698,807 B1
(45) Date of Patent: Jul. 4, 2017

(54) TIME SIGNAL CONVERSION USING DUAL TIME-BASED DIGITAL-TO-ANALOG CONVERTERS

(71) Applicant: Silicon Laboratories Inc., Austin, TX (US)

(72) Inventors: Aaron J. Caffee, Scappoose, OR (US); Brian G. Drost, Corvallis, OR (US); Volodymyr Kratyuk, Hillsboro, OR (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/199,257

(22) Filed: Jun. 30, 2016

(51) Int. Cl.
*H03M 1/66* (2006.01)
*H03M 1/10* (2006.01)
*H03M 1/82* (2006.01)

(52) U.S. Cl.
CPC ....... *H03M 1/1009* (2013.01); *H03M 1/1057* (2013.01); *H03M 1/66* (2013.01); *H03M 1/82* (2013.01)

(58) Field of Classification Search
CPC ..... H03M 1/1009; H03M 1/1057; H03M 1/82
USPC .................................................. 341/120, 144
See application file for complete search history.

(56) References Cited

U.S. PATENT DOCUMENTS

| 7,248,122 B2* | 7/2007 | Morrill | H03M 9/00 331/1 A |
| 7,764,126 B2* | 7/2010 | Shioda | G06F 1/04 331/16 |
| 7,912,882 B2* | 3/2011 | Kim | G06F 1/0328 708/271 |
| 8,462,840 B2 | 6/2013 | Chen | |
| 8,531,246 B2 | 9/2013 | Huang | |
| 8,669,810 B2 | 3/2014 | Kwon | |
| 8,692,599 B2 | 4/2014 | Gong et al. | |
| 8,736,476 B2 | 5/2014 | Gong et al. | |

(Continued)

OTHER PUBLICATIONS

Alahdab, S. et al., "A 12-Bit Digital-to-Time Converter (DTC) with sub-ps-level resolution using current DAC and differential switch for Time-to-Digital Converter (TDC)," IEEE International Instrumentation and Measurement Technology Conference (I2MTC), May 13-16, 2012, pp. 2668-2671.

Beards, R.D. and Copeland, M.A., "An Oversampling Delta-Sigma Frequency Discriminator," IEEE Transactions on Circuits and Systems-II: Analog and Digital Signal Processing, vol. 41, No. 1, Jan. 1994, pp. 26-32.

(Continued)

*Primary Examiner* — Brian Young
(74) *Attorney, Agent, or Firm* — Zagorin Cave LLP (57) ABSTRACT

A technique for on-chip time measurement includes dynamically scaling a range of a time-based digital-to-analog converter to enhance resolution of the time measurement. An apparatus includes a first time-based digital-to-analog converter configured to generate a first clock signal based on a first reference clock signal and a first digital code. The apparatus includes a second time-based digital-to-analog converter configured to generate a second clock signal based on a second reference clock signal and a second digital code. The first reference clock signal has a first frequency and the second reference clock signal has a second frequency that is harmonically related to the first frequency. The apparatus includes a time signal converter configured to generate an output signal having a level indicative of a time-of-arrival of a first edge of the first clock signal relative to a time-of-arrival of a second edge of the second clock signal.

20 Claims, 6 Drawing Sheets

(56) References Cited

U.S. PATENT DOCUMENTS

| | | |
|---|---|---|
| 8,773,182 B1 | 7/2014 | Degani |
| 8,994,573 B2 | 3/2015 | Henzler |
| 9,007,251 B2 | 4/2015 | Perthold |
| 9,071,304 B2 | 6/2015 | Banin |
| 9,137,084 B2 | 9/2015 | Degani |
| 9,209,958 B1 | 12/2015 | Palaskas |
| 9,379,878 B1 * | 6/2016 | Lugthart ................ H04L 7/033 |
| 2004/0174286 A1 | 9/2004 | Donovan |
| 2007/0096836 A1 | 5/2007 | Lee |
| 2008/0068236 A1 | 3/2008 | Sheba |
| 2011/0156783 A1 | 6/2011 | Pavlovic |
| 2013/0033293 A1 | 2/2013 | Zhang |
| 2014/0002288 A1 | 1/2014 | Scholz |
| 2014/0176201 A1 | 6/2014 | Weltin-Wu |
| 2014/0266822 A1 | 9/2014 | Henzler |
| 2015/0145567 A1 | 5/2015 | Perrott |
| 2015/0145569 A1 | 5/2015 | Perrott |
| 2015/0145570 A1 | 5/2015 | Perrott |
| 2015/0145571 A1 | 5/2015 | Perrott |

OTHER PUBLICATIONS

Galton, I. and Zimmerman, G., "Combined RF Phase Extraction and Digitization," IEEE Symposium on Circuits and Systems, 1993, pp. 1104-1107.

Ru, J., et al., "A High-Linearity Digital-to-Time Converter Technique: Constant-Slope Charging," IEEE Journal of Solid-State Circuits, vol. 50, No. 6, Jun. 2015, pp. 1412-1423.

Talegaonkar, M., et al., "A 4.4-5.4GHz Digital Fractional-N PLL Using ΔΣ Frequency-to-Digital Converter," IEEE Symposium on VLSI Circuits Digest of Technical Papers, 2014, 2 pages.

Venerus, C. and Galton, I, "Delta-Sigma FDC Based Fractional-N PLLs," IEEE Transactions on Circuits and Systems-I: Regular Papers, 2012, pp. 1-12.

Wikipedia, "Time-to-digital converter," downloaded from http://en.wikipedia.org/wikifTime-to-digital_converter on May 8, 2015, 12 pages.

Young, B. et al., "A 2.4ps Resolution 2.1mW Second-Order Noise-Shaped Time-to-Digital Converter with 3.2ns Range in 1MHz Bandwidth," IEEE Custom Integrated Circuits Conference, 2010, pp. 1-4.

* cited by examiner

TIME SIGNAL CONVERSION USING DUAL TIME-BASED DIGITAL-TO-ANALOG CONVERTERS

FIELD OF THE INVENTION

The present invention is related to data converters and more particularly to conversion of data conveyed using time signals.

DESCRIPTION OF THE RELATED ART

In general, a signal may convey data using time by varying the period of the signal or by varying the phase or delay of the signal. Conventional integrated circuit techniques for measuring the time information may trade off between precision of a measurement and a range of the measurement. Accordingly, improved techniques for measuring time information in a signal are desired.

Summary of Embodiments of the Invention

In at least one embodiment of the invention, an apparatus includes a first time-based digital-to-analog converter configured to generate a first clock signal based on a first reference clock signal and a first digital code. The apparatus includes a second time-based digital-to-analog converter configured to generate a second clock signal based on a second reference clock signal and a second digital code. The first reference clock signal has a first frequency and the second reference clock signal has a second frequency that is harmonically related to the first frequency. The apparatus includes a time signal converter configured to generate an output signal having a level indicative of a time-of-arrival of a first edge of the first clock signal relative to a time-of-arrival of a second edge of the second clock signal. The apparatus may include control logic configured to update a gain calibration signal based on nonlinearity associated with the first time-based digital-to-analog converter. The nonlinearity may be identified using stored digital versions of the output signal and corresponding values of the first digital code and the second digital code. The first time-based digital-to-analog converter may be configured to generate the first clock signal based on the gain calibration signal. The time signal converter may include a phase detector configured to generate a phase error signal based on the phase difference between the first clock signal and the second clock signal. The time signal converter may include a time-to-voltage time signal converter configured to generate the output signal having a level indicative of the phase error signal. The time signal converter may include an analog-to-digital time signal converter configured to generate a digital error code corresponding to the level of the output signal. The time signal converter may include storage configured to store the digital error code corresponding to the first digital code and the second digital code. The time signal converter may include control logic configured to update a gain calibration signal based on nonlinearity associated with the first time-based digital-to-analog converter. The nonlinearity may be identified using the digital error code, the first digital code, and the second digital code. The control logic may be further configured to incrementally adjust the first digital code monotonically and to store a corresponding digital error code for each set of values of the first digital code and the second digital code. The control logic may be further configured to incrementally adjust the second digital code monotonically and to reset the first digital code in response to the digital error code having a value in a predetermined range.

In at least one embodiment of the invention, a method includes generating a first clock signal based on a first reference clock signal and a first digital code. The method includes generating a second clock signal based on a second reference clock signal and a second digital code. The first reference clock signal has a first frequency and the second reference clock signal has a second frequency that is harmonically related to the first frequency. The method includes generating an output signal having a level indicative of a time-of-arrival of a first edge of the first clock signal relative to a time-of-arrival of a second edge of the second clock signal. The method may include updating a gain calibration signal based on nonlinearity associated with the first time-based digital-to-analog converter. The nonlinearity may be identified using stored digital versions of the output signal and corresponding values of the first digital code and the second digital code. The first clock signal may be generated further based on the gain calibration signal. Generating the output signal may include generating an error signal based on the phase difference between the first clock signal and the second clock signal. Generating the output signal may include generating the output signal having a level indicative of the error signal. The method may include generating a digital output code corresponding to the level of the output signal. The method may include storing the digital output code corresponding to the first digital code and the second digital code. The method may include updating a gain calibration signal based on a nonlinearity associated with the first clock signal, the nonlinearity being identified using the digital output code, the first digital code, and the second digital code. The method may include incrementally adjusting the first digital code monotonically and storing the digital output code corresponding to each set of values of the first digital code and the second digital code. The method may include incrementally adjusting the second digital code monotonically and resetting the first digital code in response to the digital output code having a value in a predetermined range. The method may include updating a gain calibration signal based on nonlinearity associated with the first time-based digital-to-analog converter. The nonlinearity may be identified using stored digital versions of the output signal and corresponding values of the first digital code and the second digital code. The first clock signal may be generated further based on the gain calibration signal.

A method of manufacturing an integrated circuit including a time-based digital-to-analog converter includes characterizing a gain of a first time-based digital-to-analog converter using range scaling of a pulse width associated with a time difference signal. The time difference signal indicates a time difference between a first signal generated using the first time-based digital-to-analog converter and a second signal generated using a second time-based digital-to-analog converter. The method of manufacturing includes adjusting the gain of the first time-based digital-to-analog converter in response to a nonlinearity of the gain of the first time-based digital-to-analog converter detected by the characterizing. The method of manufacturing may include generating the first signal by adjusting a delay of a reference clock signal based on a first digital code. The method of manufacturing may include generating the first signal by adjusting a period of a reference clock signal based on a first digital code.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
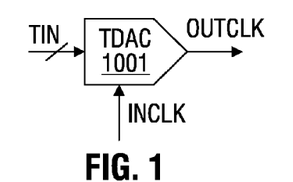
FIG. 1 illustrates a functional block diagram of an exemplary time-based digital-to-analog converter configured to generate an output signal based on a digital control word and a reference clock signal.
Figure 2:
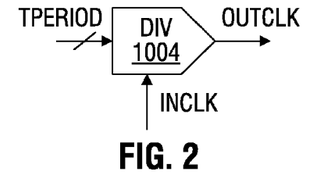
FIG. 2 illustrates a functional block diagram of an exemplary time-based digital-to-analog converter configured to generate an output signal having a period based on a digital control word and a reference clock signal.

In general, an analog signal may be generated by a time-based digital-to-analog converter (i.e., a digital-to-time converter) that generates an output signal having a period or edge delay based on a digital control word and a reference clock signal. Referring to FIG. 1, time-based digital-to-analog converter (TDAC) 1001 generates output clock signal OUTCLK based on reference clock signal INCLK and digital control word TIN. Time-based digital-to-analog converter (TDAC) 1001 may be an integer divider, a fractional divider, an interpolative divider, or a digitally-controlled delay element. Output clock signal OUTCLK may have a period based on digital control word TIN, a delay through the signal path based on TIN, or a combination thereof based on digital control word TIN. For example, referring to FIG. 2, clock divider 1004 is a digital-to-time converter that generates output clock signal OUTCLK based on reference clock signal INCLK and having a period based on digital control word TPERIOD, which indicates a divide ratio (e.g. an integer divide ratio or a fractional divide ratio). The analog output is the period of output clock signal OUTCLK, which is based on digital control word TPERIOD and the clock period of reference clock signal INCLK. Output clock signal OUTCLK has a digitally-defined, full-scale range and a least-significant bit clock period. Divider 1004 may be a digital-to-time period converter that generates output clock signal OUTCLK having a period based on an integer multiplication of the clock period of input clock signal INCLK and having static and bounded quantization error and random jitter based on thermal noise. Divider 1004 may be configured as a fractional clock frequency divider implemented by dithering a value of digital control word TPERIOD to generate output clock signal OUTCLK having an average output clock period that is based on a fractional multiplication of the clock period of input clock signal INCLK.

Figure 3:
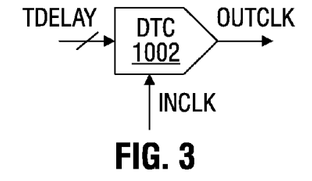
FIG. 3 illustrates a functional block diagram of an exemplary time-based digital-to-analog converter configured to generate an output signal having an edge delay based on a digital control word and a reference clock signal.
Figure 4:
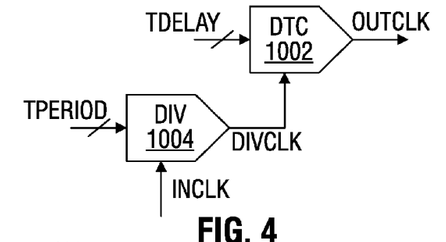
FIG. 4 illustrates a functional block diagram of an exemplary time-based digital-to-analog converter including a serial combination of the exemplary time-based digital-to-analog converters of FIGS. 1 and 2.
Figure 5:
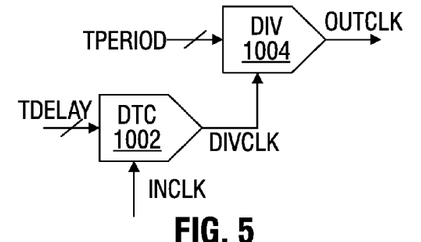
FIG. 5 illustrates a functional block diagram of an exemplary time-based digital-to-analog converter including a serial combination of the exemplary time-based digital-to-analog converters of FIGS. 1 and 2.

Referring to FIG. 3, digital-to-time converter 1002 generates output clock signal OUTCLK based on reference clock signal INCLK and digital code TDELAY, which indicates a delay introduced to an edge of output clock signal OUTCLK. Digital code TDELAY determines the path delay through digital-to-time converter 1002. The analog output is the delay of an edge of the output clock signal OUTCLK. Referring to FIGS. 4 and 5, hybrid time-based digital-to-analog converters include both a digital-to-time converter that generates an output signal having a period based on a first digital control word and a first input clock signal and a digital-to-time converter that generates an output clock signal having an edge delay based on a second digital control word and a second input clock signal. Referring to FIG. 4, divider 1004 may be configured as a dithering modulus clock divider that receives a noise-shaped integer control signal TPERIOD and reference clock signal INCLK. The noise-shaped integer control signal TPERIOD dithers between integer clock divider values to cause the integer divider to generate divided clock signal DIVCLK having a period that, on average, is a target fractional clock period. The analog quantization error of the dithering noise-shaped integer control signal causes substantial deterministic jitter that dominates the jitter performance. The analog quantization error is provided as digital code TDELAY to digital-to-time converter 1002 that generates output clock signal OUTCLK by delaying an edge of the divided clock signal DIVCLK. Similar results may be achieved by reversing the order of the time-based digital-to-analog converters, as illustrated in FIG. 5. The hybrid time-based digital-to-analog converters of FIGS. 4 and 5 provide a coarse time resolution adjustment and a fine time resolution adjustment, and behave as interpolative dividers, as described further below.

Time-based digital-to-analog converters may be used in clock synthesizer applications. For example, integer-based phase-locked loops are used extensively in clock multiplication applications that demand superior spurious performance. In clock synthesizer embodiments that generate fractional output frequencies, a prescaler digital-to-time converter (e.g., divide by P) is used in a reference path of a phase-locked loop while a separate digital-to-time converter is used in a feedback path (e.g., divide by N). Accordingly, a clock synthesizer multiplies a frequency of a reference clock signal by N/P. However, the frequency resolution supported by the clock multiplier directly constrains the maximum achievable bandwidth to approximately $f_{ref}/(10\times P)$. As a result, voltage-controlled oscillator phase noise may be significant and may translate into higher power consumption. In addition, a low loop bandwidth of the clock synthesizer may only support lower data rates than might otherwise be desired in some applications (e.g., data communication applications).

Figure 6:
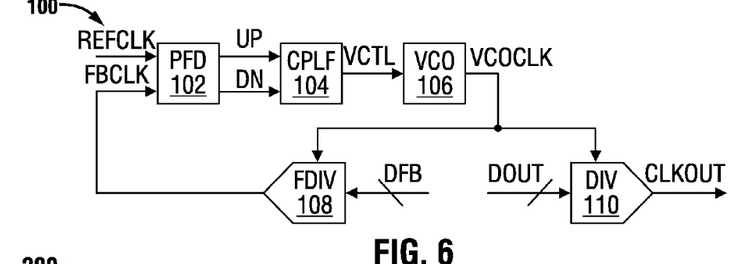
FIG. 6 illustrates a functional block diagram of an exemplary system for generating a clock signal using fractional frequency synthesis.

Referring to FIG. 6, an exemplary clock synthesizer utilizes phase-locked loop (PLL) 100, which includes multiple time-based digital-to-analog converters. Phase-locked loop includes phase/frequency detector (PFD) 102, a charge pump loop filter (CPLF) 104, and voltage-controlled oscillator (VCO) 106. Voltage controlled oscillator 106 may be implemented as a ring oscillator, an LC oscillator, or other suitable oscillator structure. Phase/frequency detector 102 receives reference clock signal REFCLK, which may be provided by a fixed source, such as a crystal oscillator, a microelectromechanical structure (MEMS) oscillator, or other suitable source. Fractional divider (FDIV) 108 introduces a digital quantization error that causes phase noise (i.e., jitter) in the feedback clock signal, FBCLK. For example, FBCLK may have jitter of up to one cycle of the VCO output, clock signal VCOCLK.

Phase-locked loop 100 multiplies reference clock signal REFCLK, having a frequency $f_{in}$, based on a divider value, to synthesize clock signal VCOCLK. Frequency $f_{out}$ of the output clock signal, CLKOUT, can be determined by a divider value DFB of the feedback divider in the phase-locked loop, and in embodiments including output divider 110, a divider value DOUT of output divider 110:

$$f_{out} = f_{in} \frac{DFB}{DOUT}.$$

Feedback divider 108 includes a digital-to-time converter that may be a fractional-N feedback divider receiving clock signal VCOCLK as the reference clock signal and digital control word DFB. Digital control word DFB is a divide value sequence of integers corresponding to a target fractional divider ratio. Clock signal VCOCLK may be further divided by output divider 110, which may be an integer clock divider including a digital-to-time converter that generates the output clock signal CLKOUT having a period based on clock signal VCOCLK as the reference clock signal and integer divide value DOUT. In applications with demanding spur specifications, another integer clock divider (not shown) receives another reference clock signal and an input divide value DIN and generates reference clock signal REFCLK provided to phase frequency detector 102. Note that in such embodiments an integer clock divider may be used instead of fractional divider 108 and DIN, DFB, and DOUT may have integer values to generate output clock signal CLKOUT, a signal having a frequency:

$$f_{out} = f_{in} \frac{DFB}{DIN \times DOUT}.$$

However, an input integer divider provides frequency resolution at the expense of phase noise. Using a fractional-based digital word for DFB and fractional divider 108 instead of an integer input divider and an integer feedback divider, supports higher output frequency resolution. The phase-locked loop behaves like a digital-to-analog converter reconstruction filter and reduces or eliminates high-frequency quantization noise. The higher phase-locked loop bandwidths improve VCO noise suppression but introduce deterministic jitter.

Figure 7:
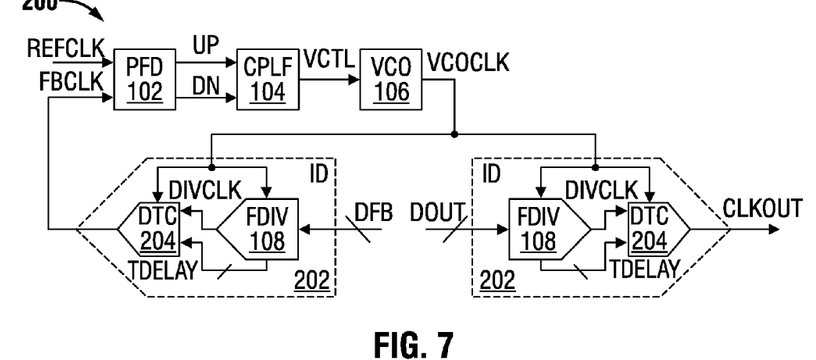
FIG. 7 illustrates a functional block diagram of an exemplary system for generating a clock signal using an interpolative divider.

Referring to FIG. 7, a technique for reducing jitter in a phase-locked loop includes delay-based quantization noise cancellation. The technique uses interpolative divider (ID) 202, which is a hybrid time-based digital-to-analog converter topology, described above. Similar to a current-mode phase interpolation technique, digital-to-time converter (DTC) 204 receives an error residue that attempts to adjust delay for phase errors introduced by a dynamic feedback divider. This approach addresses the phase error early in the signal path, causes the downstream phase detector and associated charge pump loop filter circuitry of the phase-locked loop to see a smaller signal, and as a result, operates more linearly than other implementations. The technique includes adjusting the phase of the frequency-divided signal at the output of the fractional divider, according to a digital code TDELAY, generated by fractional divider 108. The technique applies the digital code TDELAY to digital-to-time converter 204 and performs the subtraction in the time domain. Accordingly, any linearity requirement imposed by the quantization noise cancellation is limited to digital-to-time converter 204. This technique reduces phase errors seen by the front-end of PLL 200 (e.g., phase detector 102) as compared to the phase errors seen by the front-end of PLL 100 of FIG. 6. Referring back to FIG. 7, ratio-metric techniques may be used to reduce digital-to-time converter gain error. Moreover, the delay-based quantization noise compensation is easily adapted to output divider configurations. Interpolative divider techniques for reducing noise associated with a fractional-N divider are described in U.S. Pat. No. 7,417,510, filed Oct. 17, 2006, entitled "Direct Digital Interpolative Synthesis," naming Yunteng Huang as inventor, which application is hereby incorporated by reference.

Interpolative divider 202 includes fractional divider 108 and digital-to-time converter 204. Fractional divider 108 may include a dithering modulus divider (e.g., a typical first order sigma-delta modulator or higher-order sigma-delta modulator) that generates noise-shaped clock signal DIVCLK and digital code TDELAY, which is indicative of quantization error. Digital-to-time converter 204 adjusts the phase of clock signal DIVCLK according to the digital quantization error signal to reduce error in the feedback clock signal FBCLK, thereby introducing a phase adjustment prior to phase/frequency detector 102 of PLL 200. Interpolative divider 202 is a sub-ranging digital-to-time period converter that generates an output signal with an average fractional period resolution. Digital-to-time converter 204 uses digital code TDELAY to divide output quantization noise by up to $2^{N_{frac}}$ depending on $N_{DTC}$ with respect to $N_{frac}$, where $N_{DTC}$ is the number of bits by which digital-to-time converter 204 reduces the quantization noise, $N_{frac}$ is the number of bits used to represent the fractional portion of the divide ratio, i.e., the fractional portion bitwidth, and $N_{DTC}$ is less than or equal to $N_{frac}$. Error of digital-to-time converter 204 limits the resolution of the digital-to-analog conversion of interpolative divider 202.

Figure 8:
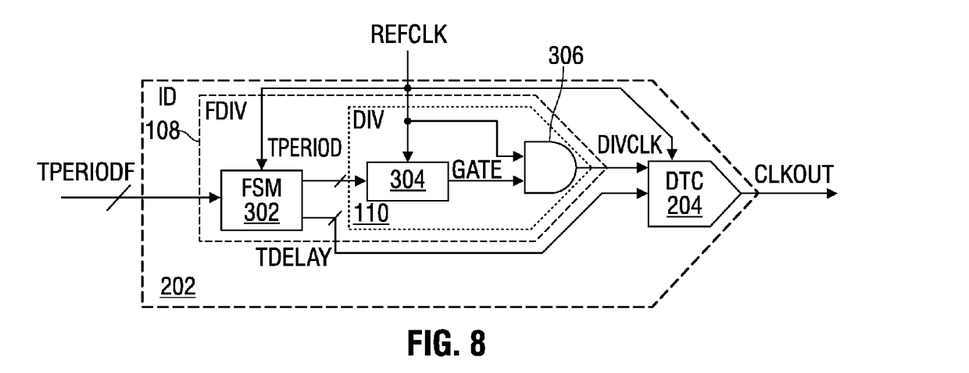
FIG. 8 illustrates a functional block diagram of an exemplary interpolative divider of FIG. 6.

Referring to FIG. 8, in at least one embodiment, fractional divider 108 of interpolative divider 202 includes finite-state machine 302 that generates digital code TPERIOD, which dithers between different divide values, and an associated digital code TDELAY. Counter 304 generates a gating signal that is used to select and stretch pulses of clock signal REFCLK (e.g., by digitally gating clock signal REFCLK with the gating signal using AND-gate 306 or other suitable logic circuit) to generate clock signal DIVCLK.

Ideally, the digital-to-time converter transfer function, i.e., the output time delay as a function of digital code TDELAY, is:

$$T_{DTC}(TDELAY) = T_{DTC,DAC} + T_{DTC,OS}$$

where $$T_{DTC,DAC} = \frac{T_{ref}}{2^{N_{DTC}}} TDELAY,$$

and $T_{DTC,OS}$ is an output delay offset. The output delay offset is not a function of digital code TDELAY, but rather is affected by environmental factors, and may be assumed to be zero with respect to deterministic jitter. The full-scale range of the phase interpolator delay is ideally one reference clock period $T_{ref}$, which is one period of reference clock signal REFCLK. For example, for a two-bit phase interpolator, digital code TDELAY may have values 00, 01, 10, and 11, which correspond to discrete $T_{DTC,DAC}$ values of 0, $T_{ref}/4$, $2 \times T_{ref}/4$, and $3 \times T_{ref}/4$. A delay of $4 \times T_{ref}/4$ corresponds to an entire period of reference clock signal REFCLK, i.e., reference clock period $T_{ref}$. The digital-to-time converter error includes a difference in digital-to-time converter output from the expected discrete $T_{DTC,DAC}$ values. The component of digital-to-time converter error that is linearly related to digital code TDELAY is referred to as gain error and a component of phase interpolator error that is randomly related to digital code TDELAY is referred to as mismatch error. In addition, higher order gain error may be present (e.g., systematic nonlinearities). Both gain error and mismatch error affect peak-to-peak deterministic jitter.

Figure 9:
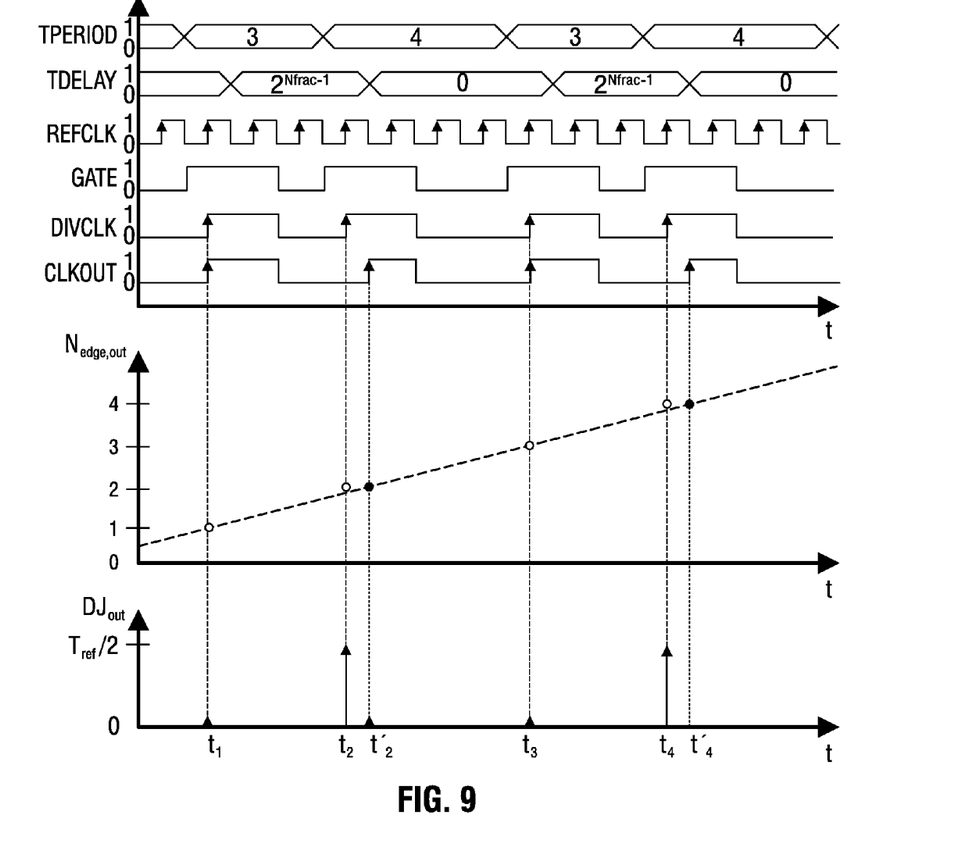
FIG. 9 illustrates timing waveforms for the exemplary interpolative divider of FIG. 7.

Referring to FIGS. 8 and 9, for an exemplary fractional divide ratio of 3.5, TPERIODF=$(11.10)_2$, the noise-shaped integer divider value, digital code TPERIOD dithers between 3 and 4 and the digital code TDELAY dithers between $2^{N_{frac}-1}$ and 0. Integer divider 110 generates clock signal DIVCLK that has a period of three times the period of reference clock signal REFCLK when digital code TPERIOD=3 (e.g., between time $t_1$ and $t_2$) and has a period of four times the period of reference clock signal REFCLK when digital code TPERIOD=4 (e.g., between times $t_2$ and $t_3$). Then, digital-to-time converter 204 delays the edge of clock signal DIVCLK according to the digital quantization error signal to generate output clock signal CLKOUT, having a period that is 3.5 times the period of reference clock signal REFCLK. Note that the period between times $t_1$, and $t_2'$, the period between times $t_2'$ and $t_3$, and the period between times $t_3$ and $t_4'$ is 3.5 times the period of reference clock signal REFCLK. However, the output duty cycle of output clock signal CLKOUT is not 50%. In at least one embodiment, a divide by two may be used to generate an output signal having a 50% output duty cycle. The deterministic jitter of clock signal DIVCLK at $t_2$ and $t_4$ is half of reference clock period, $T_{ref}/2$ and is cancelled by digital-to-time converter 204.

Figure 10:
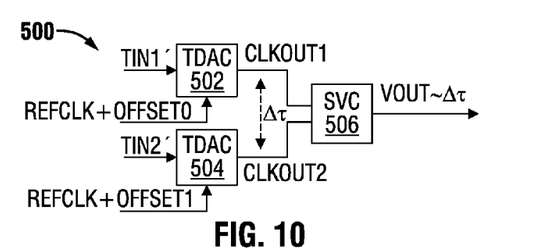
FIG. 10 illustrates a functional block diagram of technique for measuring gain of a time-based digital-to-analog converter consistent with at least one embodiment of the invention.

In the exemplary applications of time signals described above, quantization noise may be effectively reduced or eliminated if the time-based digital-to-analog converter has linear gain. In general, a time measurement may be used to measure and calibrate any linearity of the gain of the time-based digital-to-analog converter, measure skew between clock signals (e.g. detect phase-locked loop static phase error, clock skews between multiple I/Os, etc.), measure duty cycle distortion, perform on-chip jitter characterization, or other suitable time measurements. In general, time measurements may trade off precision of the time measurements for range of the time measurements. A technique for improving time resolution of an on-chip time measurement includes dynamically scaling a range of a time-based digital-to-analog converter to enhance resolution of the time measurement. Referring to FIG. 10, exemplary measurement circuit 500 measures clock signal CLKOUT1, which is generated by time-based digital-to-analog converter 502 relative to clock signal CLKOUT2, which is generated by time-based digital-to-analog converter 504 that operates synchronously to time-based digital-to-analog converter 502. Although time-based digital-to-analog converter 502 and time-based digital-to-analog converter 504 of FIG. 10 each receive REFCLK varied by a corresponding offset, OFFSET0 and OFFSET1, respectively, in other embodiments, time-based digital-to-analog converter 502 and time-based digital-to-analog converter 504 receive different harmonics of REFCLK varied by a corresponding offset. By adjusting the phases between CLKOUT1 and CLKOUT2 and scaling the range of the level of the output signal generated by a signal converter based on the skew or phase difference between CLKOUT1 and CLKOUT2, the output signal level may have increased range and precision, as compared to conventional time measurement techniques. For example, skew-to-voltage converter (SVC) 506 generates output voltage level VOUT that indicates the magnitude of phase difference AT between CLKOUT1 and CLKOUT2.

Figures 11, 12, 14:
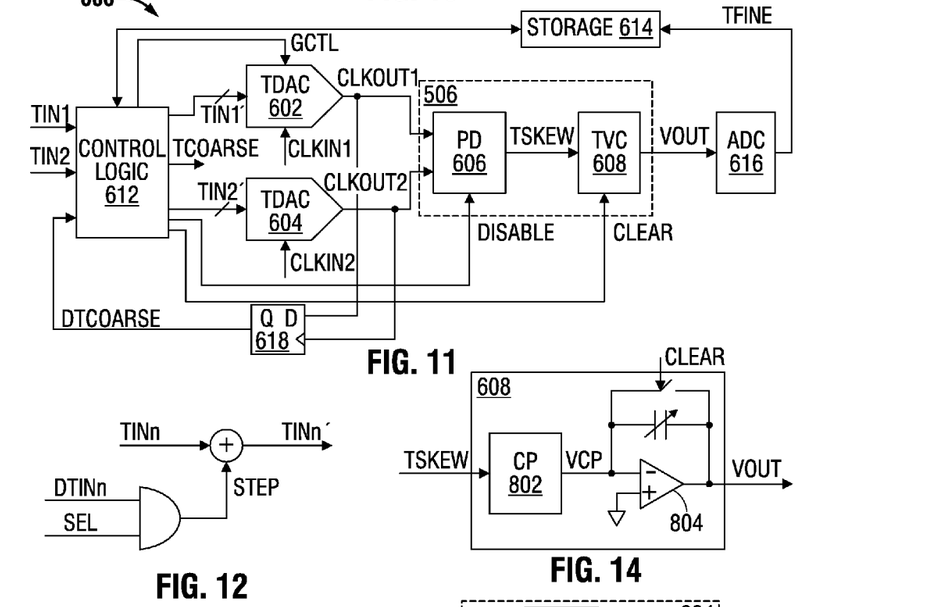
FIG. 11 illustrates a functional block diagram of a system for characterizing and calibrating a time-based digital-to-analog converter consistent with at least one embodiment of the invention.
FIG. 12 illustrates exemplary logic for generating a digital control word for a time-based digital-to-analog converter.
FIG. 14 illustrates an exemplary time-to-voltage converter for the system of FIG. 11.
Figure 13:
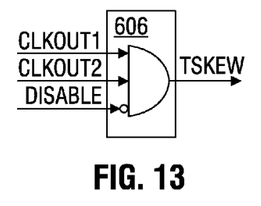
FIG. 13 illustrates an exemplary phase detector for the system of FIG. 11.
Figure 15:
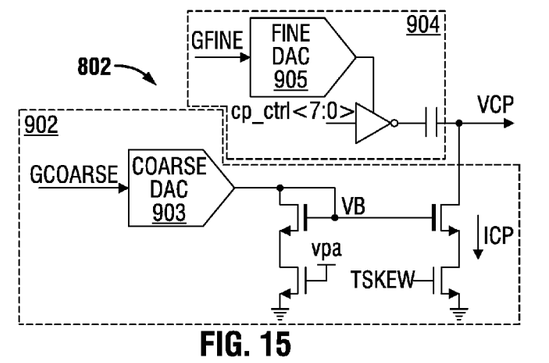
FIG. 15 illustrates an exemplary charge pump for the system of FIG. 11.

Referring to FIG. 11, in at least one embodiment of the measurement technique, skew-to-voltage converter 506 generates output voltage level VOUT that has a voltage level indicative of phase difference AT between CLKOUT1 and CLKOUT2. Analog-to-digital converter 616 converts output voltage level VOUT to digital code TFINE with high precision. Skew-to-voltage converter 506 may include phase detector 606, which may be an analog phase detector (e.g., illustrated in FIG. 13) that provides an output signal having a pulse width modulated according to the difference in time between edges of CLKOUT1 and CLKOUT2, and provides error signal TSKEW to time-to-voltage converter 608 of FIG. 11. In at least one embodiment, phase detector 606 produces only a down pulse and requires an initial phase difference between CLKOUT1 and CLKOUT2 to linearly provide an output signal. Accordingly, a capacitive digital-to-analog converter circuit may be included in time-to-voltage converter 608 to compensate for that initial phase difference. Referring to FIG. 14, an exemplary time-to-voltage converter 608 includes charge pump 802, which converts a pulse-width modulated error signal TSKEW into voltage level VCP. In at least one embodiment, charge pump 802 has a selectable gain and the output buffer has a selectable output voltage range. An exemplary implementation of charge pump 802 includes a source-switch current source, as illustrated in FIG. 15. Digital-to-analog converter 904 may include the same number of stages as the number of pumps in a conversion cycle of circuit 902. The charge pump current may be trimmed during production test to a nominal value implementation.

Referring back to FIG. 14, output buffer 804 and a variable capacitance in the feedback path of output buffer 804 form a sample-and-hold circuit used to generate output voltage level VOUT. By repeatedly transferring pulses and storing voltages on a capacitor, a large charge pump current is not needed, resulting in an implementation using less area and power than other charge pump implementations. Referring back to FIG. 11, analog-to-digital converter 616 converts the output voltage level VOUT into digital code, which may be stored in storage 614 for future use. Note that phase detector 606 of FIG. 13, time-to-voltage converter 608 of FIG. 14, and charge pump 802 of FIG. 15 are exemplary only and in other embodiments, skew-to-voltage converter 506 includes different phase detection and time-to-signal level converters.

Referring back to FIG. 11, during system calibration, control logic 612 may generate values of digital code TIN1' and digital code TIN2' for conversion into clock signals CLKOUT1 and CLKOUT2, respectively, using corresponding reference clock signal CLKIN1 and reference clock signal CLKIN2. Reference clock signal CLKIN1 and reference clock signal CLKIN2 may have the same frequency or may have harmonically related frequencies and may have corresponding offsets from another reference clock signal. Referring to FIGS. 11 and 12, when time-based digital-to-analog converter 602 and time-based digital-to-analog converter 604 include digital-to-time converters that generate output clock signals based on reference clock signals and a digital code that indicates a delay introduced to an edge of output clock signal, control logic 612 receives digital control signal TINn (e.g., digital control signal TIN1 or digital control signal TIN2) and generates digital control word TINn' (e.g., digital control word TIN1' or digital control word TIN2'), which includes m+1 bits, where m is an integer and m≥0. At least n+1 of the m+1 bits correspond to a control word for a corresponding digital-to-time converter, where n is ≤m, and n is an integer and n≥0. For example, time-based digital-to-analog converter 602 and time-based digital-to-analog converter 604 may be any of the time based digital-to-analog converters of FIGS. 2-5 and TIN1'(n:0) corresponds to digital code TDELAY and when m>n TIN1' (m:n+1) corresponds to digital code TPERIOD. Referring to FIGS. 11 and 12, in at least one embodiment control logic 612 applies a step (e.g., by incrementing or decrementing) to control signal TINn. Control signal SEL applies a step to control signal TINn having a magnitude based on signal DTINn to generate digital code TINn'. Application of the step applies a predetermined change in delay through the time-based digital-to-analog converter. Note that signal DTINn may be a multi-bit signal and control logic 612 may include additional AND gates and/or a multi-bit adder circuit to implement a corresponding multi-bit predetermined change in delay signal STEP. In other embodiments in which time-based digital-to-analog converter 602 and time-based digital-to-analog converter 604 generate output clock signals based on reference clock signal and a digital code that indicates a target period of the output clock signal, rather than apply a predetermined step change to control signal TINn, control logic 612 applies an impulse to the adder according to control signal SEL (e.g., to change a divide value by one during a particular period of the output clock signal to achieve a target average output clock period).

Referring to FIG. 11, control logic 612 may generate values of digital code TIN1' and digital code TIN2' that are used to increase the range of measurements of CLKOUT1 generated using time-to-voltage converter 608, while maintaining a predetermined resolution of time-to-voltage converter 608, as compared to a measurement of CLKOUT1 made using a time-to-voltage conversion having a predetermined resolution that spans only the range of digital code TIN1'. In at least one embodiment of measurement system 600, control logic 612 delays the output of time-based digital-to-analog converter 602 with respect to time-based digital-to-analog converter 604 so that the gain linearity of time-based digital-to-analog converter 602 may be characterized over a greater range than otherwise achievable with a fine resolution. Control logic 612 may then use the gain linearity information to calibrate time-based digital-to-analog converter 602 with high precision.

In at least one embodiment of the measurement technique, CLKOUT1 and CLKOUT2 must have a minimum static phase offset between them to prevent phase detector 606 from operating in a dead zone. Control logic 612 may configure any static phase offset suitable for a particular phase detector implementation prior to measurement. Control logic 612 may sweep a static phase offset by adjusting digital code TIN1' and observing the output of phase detector 606 to identify, as a target range of operation, a range in which TSKEW changes sign. Signal DTCOARSE, which indicates whether or not CLKOUT1 leads CLKOUT2, may be generated using D flip-flop 618. Control logic 612 adjusts time-based digital-to-analog converter 604 based on signal DTCOARSE so that the range of time-to-voltage converter 608 may be applied to a fraction of the region of operation of time-based digital-to-analog converter 602, thereby increasing the resolution of each measurement. The range of the measurements may be increased by incrementing a static phase offset between digital code TIN1' and digital code TIN2' and by incrementing digital code TIN2'. In at least one embodiment of the measurement technique, only a portion of the range of time-to-voltage converter 608 may be of interest. System 600 may identify that portion (e.g., by characterization during production test or initialization) and may determine a range of static phase offsets between digital code TIN1' and digital code TIN2' (e.g., a minimum value of digital code TIN2' and a maximum value of digital code TIN2') and store those values in memory. In at least one embodiment, control logic 612 sums consecutive values of signal DTCOARSE to generate signal TCOARSE, which indicates how much CLKOUT1 leads or lags CLKOUT2.

Control logic 612 may aggregate TCOARSE and TFINE so that larger measurement intervals may be digitized in some applications (e.g., for use in a time-to-digital converter application that can digitize large time intervals with high resolution).

Figure 22:
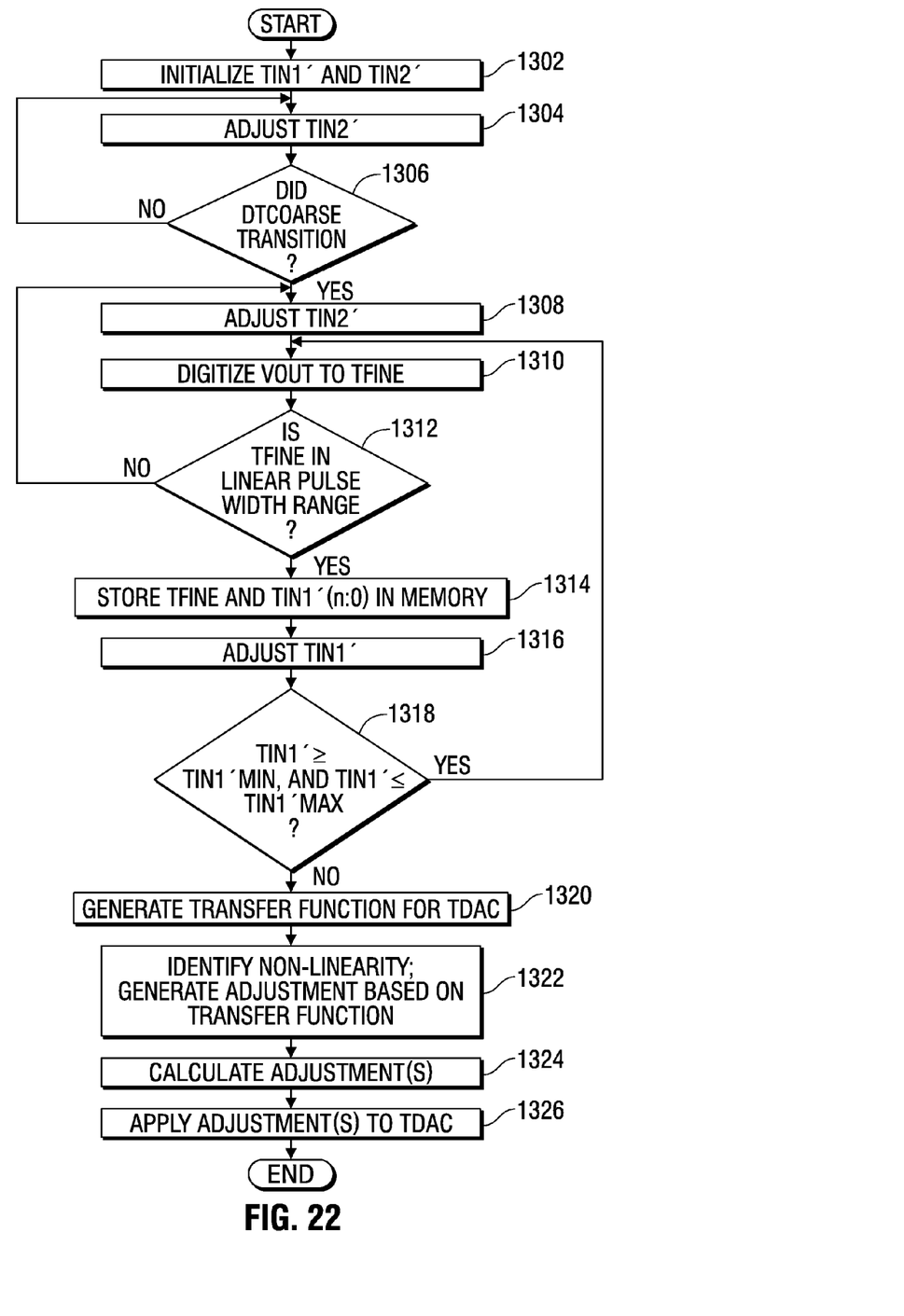
FIG. 22 illustrates exemplary information and control flows for the system of FIG. 11 consistent with at least one embodiment of the invention.

Referring to FIGS. 11 and 22, in at least one embodiment, control logic 612 initializes digital code TIN1' and digital code TIN2' (1302). Control logic 612 may generate digital code TIN1' and digital code TIN2' using corresponding internal digital signals DTIN1 and DTIN2 consistent with logic in FIG. 12 described above or by other suitable techniques. Referring back to FIGS. 11 and 22, control logic 612 adjusts digital code TIN2' (e.g., by incrementing or decrementing digital signal DTIN2) to search for edge alignment between CLKOUT1 and CLKOUT2 (1304). If the adjustment to digital code TIN2' does not cause a transition to phase detector output DTCOARSE (1306), then control logic 612 continues to adjust digital code TIN2' (1304) and evaluate phase detector output DTCOARSE for a transition (1306) until detecting a transition. If the adjustment to digital code TIN2' causes a transition by phase detector output DTCOARSE (1306), then the edges of CLKOUT1 and CLKOUT2 are aligned or close to being aligned. Thus, control logic 612 identifies a range for digital code TIN2'. Control logic 612 may adjust digital code TIN2' to a value just prior to the transition by phase detector output DTCOARSE or may maintain digital code TIN2' at the value that resulted in the transition (1308) and digitizes voltage level VOUT as digital value TFINE (1310).

Next, control logic 612 determines whether digital value TFINE is within a predetermined linear pulse width range (1312), which may be defined by predetermined minimum and maximum values for digital value TFINE stored in memory or may be defined by minimum and maximum values for digital code TIN1'(n:0). The predetermined linear pulse width range may be determined by characterization performed during production test or during an initialization sequence and may identify minimum and maximum values for TIN1' that may be stored in memory. The predetermined linear pulse width range may correspond to predetermined minimum and maximum values of voltage level VOUT, (e.g., VOUTMIN<VOUT<VOUTMAX) generated by time-to-voltage converter 608. If digital value TFINE is not within a predetermined linear pulse width range (1312), then control logic 612 continues to adjust digital code TIN2' (1308) until digital value TFINE is within the predetermined linear pulse width range. If digital value TFINE is within a predetermined linear pulse width range (1312), then control logic 612 stores digital value TFINE and corresponding digital code TIN1' in memory, which may be on-chip or off-chip (1314). Then, control logic 612 adjusts (e.g., monotonically increments or decrements) digital code TIN1' (1316).

If digital code TIN1' is within a predetermined measurement range (e.g., TIN1'MIN≤TIN1'≤TIN1'MAX) (1318), then control logic 612 digitizes voltage level VOUT as digital value TFINE (1310) and continues to evaluate linearity (1312), store digital values TFINE in the linear range (1314), and adjust digital code TIN1' (1316) until the predetermined measurement range has been exhausted. In response to the predetermined measurement range being exhausted, control logic 612 may generate a transfer function for a digital-to-time converter within time-based digital-to-analog converter 602 (1320). For example, control logic 612 may piecewise linearly organize the measurements for each digital code TIN2' monotonically according to digital code digital code TIN1'(n:0). The least-significant bits of digital code TDELAY1 correspond to digital code TIN1' (n:0) and most-significant bits of digital code TDELAY1 are indicators of adjustments to digital code TIN2'.

Control logic 612 may generate a transfer function for the gain of time-based digital-to-analog converter 602 from the stored measurements (1320) and/or may analyze the measurements to identify nonlinearities in those measurements (1322). Control logic 612 may generate one or more adjustment values (e.g., gain adjustment value GCTL) (1324) based on the transfer function and/or any nonlinearities identified in the measurements. Those gain adjustments may be stored for later use during system operation in a target application (e.g., in time-based digital-to-analog converter 602) (1326). In at least one embodiment of a system including measurement system 600, after the adjustments have been stored, all dedicated calibration circuitry (e.g., time-based digital-to-analog converter 604, skew-to-voltage converter 506, and analog-to-digital converter 616) may be powered off or configured in a low-power mode to reduce overall power consumption of the system. Note that the measurement sequence illustrated in FIG. 22 is exemplary only and various other measurement sequences using dual time-based digital-to-analog converters consistent with the techniques described herein may be used.

Figure 16:
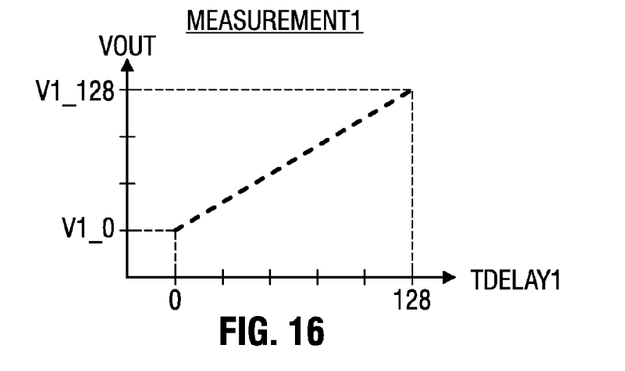
FIG. 16 illustrates an exemplary voltage output as a function of a first set of control codes for the system of FIG. 11.
Figure 17:
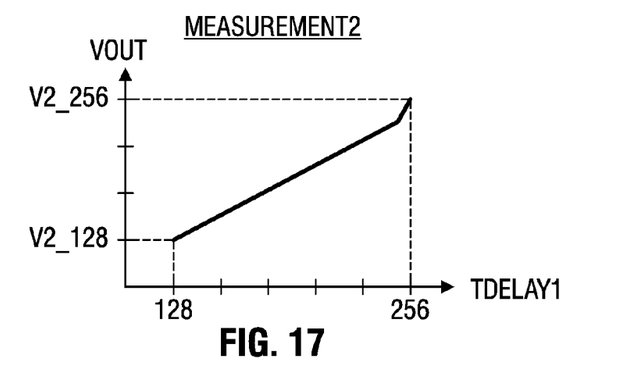
FIG. 17 illustrates an exemplary voltage output as a function of a second set of control codes for the system of FIG. 11.

Referring to FIG. 16, exemplary measurements include digital representations of output voltage level VOUT varying from V1_0 to V1_128 as a function of digital code TDELAY1, where digital code TDELAY1 is based on sweeping time-based digital-to-analog converter 602 using digital code TIN1'(n:0) and adjusting digital code TINT each time VOUT exceeds a linear voltage range, which may be indicated by most significant bits of digital code TDELAY1. Measurement 1 includes output voltage levels corresponding to digital code TIN1'(n:0) varying from 0 to 128 and TINT has an initial value determined as described above. The resulting values of VOUT vary linearly as a function of digital code TDELAY1, as digital code TDELAY1 varies from 0 to 128. When control logic 612 determines that TFINE is outside the linear pulse width range, control logic adjusts digital code TIN2' and begins a second measurement for digital code TIN1'(n:0) varying across the linear pulse range. Referring to FIG. 17, measurement 2 includes output voltage level VOUT varying from V2_128 to V2_256 as a function of digital code TDELAY1, where digital code TDELAY1 varies from 128 to 256 (e.g., digital code TIN1' (n:0) varies from 0 to 128 and digital code TINT has been adjusted for the most significant bits of digital code TDELAY1). Note that a nonlinearity for time-based digital-to-analog converter 602 occurs during measurement 2, as indicated by a change in slope at the rightmost portion of the measurement curve.

Figure 18:
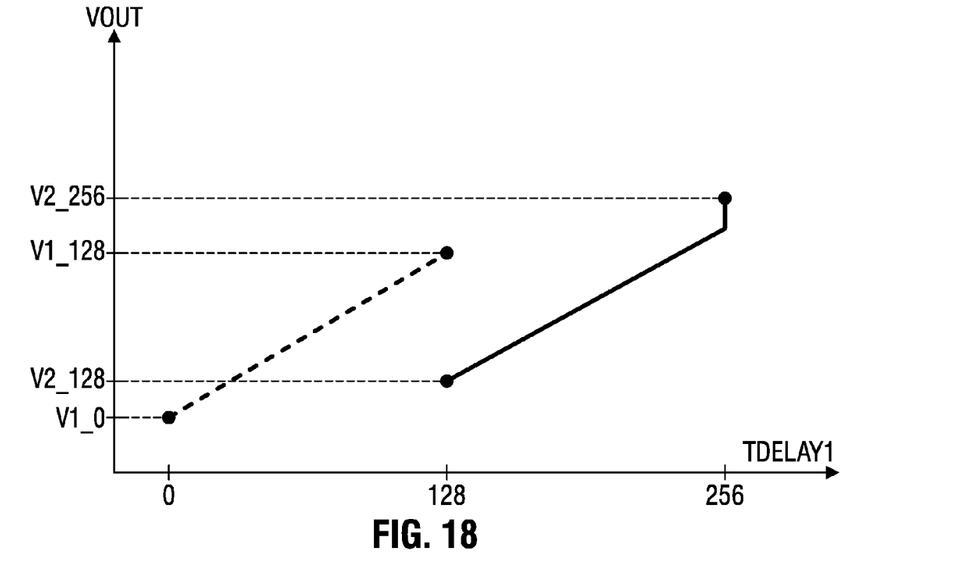
FIG. 18 illustrates an exemplary transfer function for the system of FIG. 11 including the voltage output as a function of the first set of control codes of FIG. 16 and the second set of control codes of FIG. 17 consistent with at least one embodiment of the invention.
Figure 19:
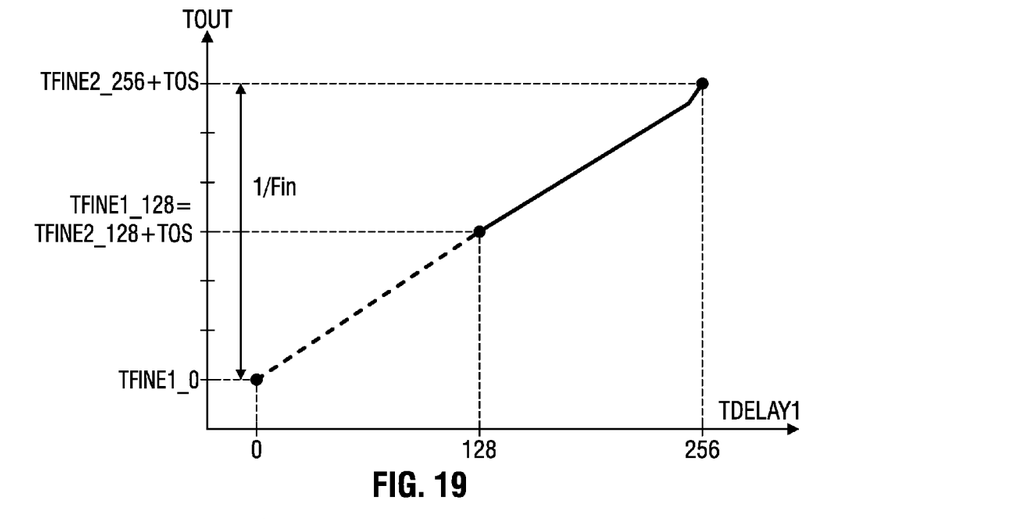
FIG. 19 illustrates an exemplary transfer function for the system of FIG. 11 including digital codes as a function of the first set of control codes of FIG. 16 and the second set of control codes of FIG. 17 consistent with at least one embodiment of the invention.

Once digital code TIN1' reaches its maximum value to indicate end of measurements, control logic 612 may piecewise linearly organize the measurements based on the associated digital codes. Referring to FIG. 18, the first and second measurements may have a voltage offset that can be identified using the overlapping measurements at TDELAY1=128. Control logic 612 may compensate for the voltage offset and arrange the corresponding offset-adjusted, digital TFINE values monotonically according to digital code TDELAY1 (FIG. 19). These data may be used to generate a transfer function for the associated time-based digital-to-analog converter, identify nonlinearities, and generate adjustments based thereon for application to the time-based digital-to-analog converter in a target application.

The measurement system and calibration techniques described herein may be applied to time-based digital-toanalog converters described above with regard to FIGS. 2-5, including digital-to-time converter 1002, multi-modulus divider 1004, or hybrids thereof. The integrated on-chip testing of time-based digital-to-analog converters may be used to determine whether or not an associated integrated circuit satisfies specifications and whether an associated integrated circuit is rejected or shipped to customers.

Referring back to FIG. 11, one or more gain control signals GCTL may be used to adjust the gain of time-based digital-to-analog converter 602 to improve the gain linearity of time-based digital-to-analog converter 602. In at least one embodiment, time-based digital-to-analog converter 602 includes an interpolative divider and gain control signal GCTL is a digital-to-time converter offset applied to a digital-to-time converter of the interpolative divider (e.g., digital-to-time converter 204 of interpolative divider 202 of FIG. 8). For each value of TDELAY received by digital-to-time converter 204, a corresponding, predetermined delay offset value is retrieved from storage to improve the linearity of a digital-to-analog conversion by applying the corresponding, predetermined delay to DIVCLK to generate CLKOUT.

Note that as referred to herein, TDELAY is used as a digital-to-time converter code having one of TDELAYMAX values, i.e., TDELAY has a value $TDELAY_i$, where $0 \le i \le TDELAYMAX-1$. In at least one embodiment, GCTL may be a delay offset code that corresponds to the digital-to-time converter code and has one of GCTLMAX values, i.e., GCTL has a value $GCTL_i$, where $0 \le i \le GCTLMAX-1$. In at least one embodiment, digital-to-time converter 204 generates a combined delay value based on TDELAY and GCTL and adjusts the phase of the frequency-divided output signal received from fractional-N divider 108, DIVCLK, based on that combined delay value to generate CLKOUT. In other embodiments, digital-to-time converter 204 performs a two-stage adjustment (e.g., includes two delay modules) that adjusts the phase of DIVCLK by the delay indicated by TDELAY (or GCTL) to generate a first adjusted signal and then adjusts that first adjusted signal based on the delay indicated by GCTL (or TDELAY). Referring back to FIG. 11, control logic 612 may provide GCTL based on the value of TIN1' being provided to time-based digital-to-analog converter 602. Control logic 612 may use TIN1' to index a corresponding entry in storage 614 of FIG. 11. Storage 614 may provide that stored offset, GCTL, to time-based digital-to-analog converter 602 concurrently with the corresponding value TIN1'.

In at least one embodiment of measurement system 600, control logic 612 determines some or all of $GCTL_i$ values during production test and stores them for later use. In at least one embodiment, system 600 wakes up from a low-power state, performs a calibration measurement that characterizes linearity of a target time-based digital-to-analog converter, determines associated $GCTL_i$ values, and applies those correction values to a circuit for an intended application. After the circuit completes operation (e.g., a burst mode operation) the system enters a power-saving mode. Since the circuit operates for a relatively short time (e.g., tens of milli-seconds) only a negligible amount of temperature variation occurs after calibration has occurred at a particular temperature. Therefore, the time-based digital-to-analog converter may maintain high resolution over the time interval of operation following a calibration technique. That calibration technique also addresses other sources of non-linearities (e.g., process variation or aging).

Figure 20:
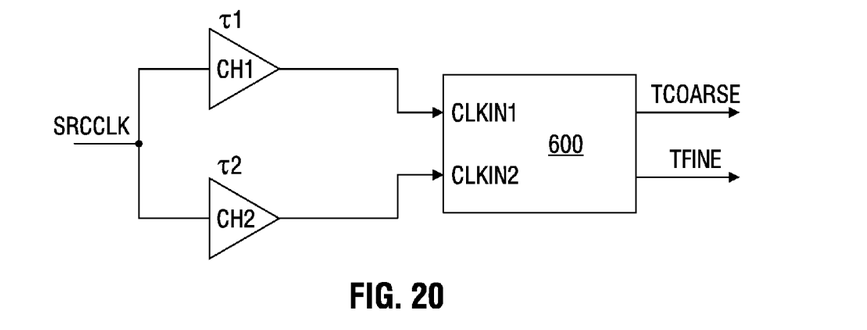
FIG. 20 illustrates an exemplary application of the system of FIG. 11 consistent with at least one embodiment of the invention.

Referring to FIGS. 6, 7, and 20, in at least one embodiment, measurement system 600 may be used to generate high resolution measurements of clock skew (e.g., $\tau_1 - \tau_2$) between different channels, e.g., CH1 and CH2, based on the same source clock signal SRCCLK. In addition, since measurement system has high precision, if it is also designed with low enough input-referred noise, measurement system 600 may be used to determine other critical time intervals or phase noise (i.e., jitter spectral density) of a system.

Figure 21:
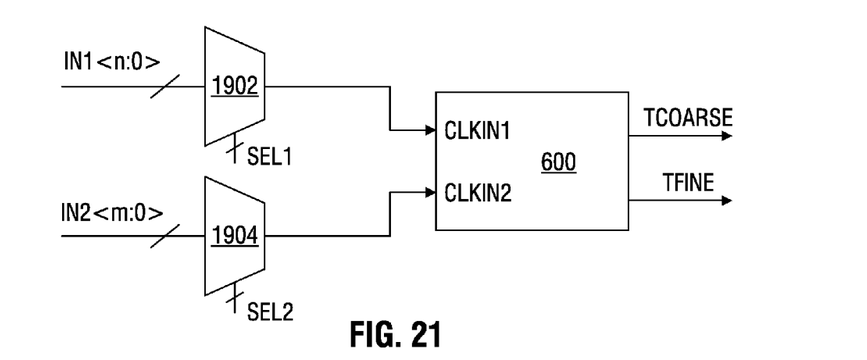
FIG. 21 illustrates selectively enabled inputs for the system of FIG. 11 consistent with at least one embodiment of the invention.

Referring to FIG. 21, measurement system 600 may be incorporated in systems including various timing signals and may be configured to make various different measurements. Select circuit 1902 and select circuit 1904 may be selectively configured to provide sets of input timing signals IN1 and IN2 to calibrate a gain error and offset of a time-to-voltage converter of system 600 and to generate measurements that may be to characterize timing relationships between different input timing signals. In at least one embodiment, measurement system 600 is configured to receive the reference clock of a phase-locked loop (e.g., REFLCK of FIGS. 6 and 7) as CLKIN1 and the output clock of the phase-locked loop (e.g., VCOCLK) or the feedback clock of the phase-locked loop (e.g., FBCLK) as CLKIN2 to measure the static phase offset of the phase-locked loop. Referring back to FIG. 20, control signals SEL1 and SEL2 may be provided from off-chip, control logic within measurement system 600, or other control logic (e.g., external microcontroller unit).

Referring back to FIG. 11, control logic 612 may also generate control signals (not shown) that adjust the gain of charge pump 802 and the output voltage range of output buffer 804 (e.g., by adjusting the variable capacitance in the feedback path of output buffer 804). In addition, control logic 612 that generates digital codes TIN1' and TIN2' may also generate other control signals (e.g., DISABLE and CLEAR for phase detector 606 and time-to-voltage converter 608, respectively, to control the sensing and signal conversion of signal converter 506) of system 600.

Structures described herein may be implemented using software executing on a processor (which includes firmware) or by a combination of software and hardware. Software, as described herein, may be encoded in at least one tangible (i.e., non-transitory) computer readable medium. As referred to herein, a tangible computer-readable medium includes at least a disk, tape, or other magnetic, optical, or electronic storage medium.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, while the invention has been described in an embodiment in using particular phase detector and charge pump implementations, one of skill in the art will appreciate that the teachings herein can be utilized with other phase detector and/or charge pump implementations. Variations and modifications of the embodiments disclosed herein, may be made based on the description set forth herein, without departing from the scope of the invention as set forth in the following claims.

What is claimed is:

1. An apparatus comprising:
    a first time-based digital-to-analog converter configured to generate a first clock signal based on a first reference clock signal and a first digital code, the first clock signal having one of a delay based on the first digital code and a period based on the first digital code;
    a second time-based digital-to-analog converter configured to generate a second clock signal based on a second reference clock signal and a second digital code, the first reference clock signal having a first frequency and the second reference clock signal having a second frequency that is harmonically related to the first frequency; and
    a time signal converter configured to generate an output signal having a level indicative of a time-of-arrival of a first edge of the first clock signal relative to a time-of-arrival of a second edge of the second clock signal.

2. The apparatus, as recited in claim 1, further comprising:
    control logic configured to update a gain calibration signal based on nonlinearity associated with the first time-based digital-to-analog converter, the nonlinearity being identified using stored digital versions of the output signal and corresponding values of the first digital code and the second digital code,
    wherein the first time-based digital-to-analog converter is configured to generate the first clock signal based on the gain calibration signal.

3. The apparatus, as recited in claim 1, wherein the time signal converter comprises:
    a phase detector configured to generate a phase error signal based on a phase difference between the first clock signal and the second clock signal;
    a time-to-voltage converter circuit configured to generate the output signal having a level indicative of the phase error signal;
    an analog-to-digital converter circuit configured to generate a digital error code corresponding to the level of the output signal; and
    storage configured to store the digital error code corresponding to the first digital code and the second digital code; and
    control logic configured to update a gain calibration signal based on nonlinearity associated with the first time-based digital-to-analog converter, the nonlinearity being identified using the digital error code, the first digital code, and the second digital code.

4. The apparatus, as recited in claim 3, wherein the control logic is further configured to incrementally adjust the first digital code monotonically and store a corresponding digital error code for each set of values of the first digital code and the second digital code.

5. The apparatus, as recited in claim 4, wherein the control logic is further configured to incrementally adjust the second digital code monotonically and to reset the first digital code in response to the digital error code having a value in a predetermined range.

6. The apparatus, as recited in claim 3, wherein the control logic is configured to incrementally adjust the second digital code to identify a target range of the second digital code based on the first clock signal and the second clock signal.

7. The apparatus, as recited in claim 1, wherein the first time-based digital-to-analog converter is an interpolative divider in a clock generator.

8. The apparatus, as recited in claim 1, wherein the delay of the first clock signal is based on the first digital code.

9. The apparatus, as recited in claim 1, wherein the period of the first clock signal is based on the first digital code.

10. The apparatus, as recited in claim 1, further comprising:
    a phase-locked loop including the first time-based digital-to-analog converter; and
    control logic configured to determine a static phase offset of the phase-locked loop and an output interpolative divider based on stored versions of the output signal and corresponding values of the first digital code and the second digital code.

11. A method comprising:
    generating a first clock signal based on a first reference clock signal and a first digital code, the first clock signal having one of a delay based on the first digital code and a period based on the first digital code;
    generating a second clock signal based on a second reference clock signal and a second digital code, the first reference clock signal having a first frequency and the second reference clock signal having a second frequency that is harmonically related to the first frequency; and
    generating an output signal having a level indicative of a time-of-arrival of a first edge of the first clock signal relative to a time-of-arrival of a second edge of the second clock signal.

12. The method, as recited in claim 11, further comprising:
    updating a gain calibration signal based on nonlinearity associated with a first time-based digital-to-analog converter, the nonlinearity being identified using stored digital versions of the output signal and corresponding values of the first digital code and the second digital code,
    wherein the first clock signal is generated further based on the gain calibration signal.

13. The method, as recited in claim 12, wherein generating the output signal comprises:
    generating an error signal based on a phase difference between the first clock signal and the second clock signal,
    wherein
    the output signal has a level indicative of the error signal;
    wherein the method further comprises generating a digital output code corresponding to the level of the output signal; and
    storing the digital output code corresponding to the first digital code and the second digital code; and
    updating a gain calibration signal based on a nonlinearity associated with the first clock signal, the nonlinearity being identified using the digital output code, the first digital code, and the second digital code.

14. The method, as recited in claim 13, further comprising:
    incrementally adjusting the first digital code monotonically and storing the digital output code corresponding to each set of values of the first digital code and the second digital code.

15. The method, as recited in claim 14, further comprising:
   incrementally adjusting the second digital code monotonically and resetting the first digital code in response to the digital output code having a value in a predetermined range.

16. The method, as recited in claim 13, further comprising:
   incrementally adjusting the second digital code to identify a target value of the second digital code based on the first clock signal and the second clock signal.

17. The method, as recited in claim 11, further comprising:
   determining a static phase offset of a phase-locked loop including a first time-based digital-to-analog converter based on stored digital codes and corresponding first digital codes and second digital codes.

18. A method of manufacturing an integrated circuit including a time-based digital-to-analog converter comprising:
   characterizing a gain of a first time-based digital-to-analog converter using range scaling of a pulse width associated with a time difference signal indicating a time difference between a first signal generated using the first time-based digital-to-analog converter and a second signal generated using a second time-based digital-to-analog converter; and
   adjusting the gain of the first time-based digital-to-analog converter in response to a nonlinearity of the gain of the first time-based digital-to-analog converter detected by the characterizing.

19. The method, as recited in claim 18, further comprising:
   generating the first signal by adjusting a delay of a reference clock signal based on a first digital code.

20. The method, as recited in claim 18, further comprising:
   generating the first signal by adjusting a period of a reference clock signal based on a first digital code.

* * * * *